(12) United States Patent
Marshall

(10) Patent No.: US 9,276,012 B2
(45) Date of Patent: Mar. 1, 2016

(54) METHOD TO MATCH SOI TRANSISTORS USING A LOCAL HEATER ELEMENT

(75) Inventor: Andrew Marshall, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 479 days.

(21) Appl. No.: 13/288,449

(22) Filed: Nov. 3, 2011

(65) Prior Publication Data
US 2012/0112823 A1    May 10, 2012

Related U.S. Application Data

(60) Provisional application No. 61/409,584, filed on Nov. 3, 2010.

(51) Int. Cl.
*H01L 21/00* (2006.01)
*H01L 27/12* (2006.01)
*H01C 17/26* (2006.01)
*H01L 49/02* (2006.01)

(52) U.S. Cl.
CPC ............ *H01L 27/1203* (2013.01); *H01C 17/26* (2013.01); *H01L 28/20* (2013.01)

(58) Field of Classification Search
CPC ...... H01L 27/1203; H01L 28/20; H01C 17/26
USPC ................................... 257/347, 369, 401, 350
See application file for complete search history.

(56) References Cited

U.S. PATENT DOCUMENTS

| 5,390,069 | A * | 2/1995 | Marshall ........................ 361/103 |
| 7,397,085 | B2 * | 7/2008 | Marshall ........................ 257/347 |
| 2007/0241333 | A1 * | 10/2007 | Park ..................... H01L 27/1296 257/61 |
| 2010/0025811 | A1 * | 2/2010 | Bronner ............ H01L 21/67103 257/528 |
| 2011/0299317 | A1 * | 12/2011 | Shaeffer ............. G11C 13/0002 365/106 |

\* cited by examiner

*Primary Examiner* — Laura Menz
(74) *Attorney, Agent, or Firm* — Jacqueline J. Garner; Frank D. Cimino

(57) ABSTRACT

An integrated circuit with a matched transistor pair with a matching resistance heater coupled to each transistor of the matched transistor pair. A method for forming a matching resistance heater. A method for operating an SOI integrated circuit containing a matched transistor pair with a matching resistance heater coupled to each transistor of the matched transistor pair.

10 Claims, 4 Drawing Sheets

METHOD TO MATCH SOI TRANSISTORS USING A LOCAL HEATER ELEMENT

This application claims the benefit of priority under U.S.C. §119(e) of U.S. Provisional Application No. 61/409,584, filed Nov. 3, 2010, the entirety of which is herein incorporated by reference.

FIELD OF THE INVENTION

This invention relates to the field of integrated circuits. More particularly, this invention relates to transistor matching of SOI transistors.

BACKGROUND OF THE INVENTION

Many circuits such as current mirrors, input pairs of operational amplifiers and comparators require matched circuit components. The mismatch between transistors in these types of devices gets larger and larger as these types of devices get smaller and smaller.

A circuit diagram of a conventional 3 bit flash analog-to-digital converter (ADC) is shown in FIG. 1. The 3-bit flash ADC employs a resistor chain with $2^N=8$ resistors 1002 (N=number of bits) and $2^N-1=7$ comparators 1004. The reference voltage 1010 for each comparator 1004 is one least significant bit (LSB) lower than the reference voltage 1008 for the comparator immediately above it 1006. Each comparator produces a "1" when its analog input 1012 is higher than the reference voltage 1010 and produces a "0" when its analog input is lower than the reference voltage. For example, if the voltage of the analog input signal 1018 lies between the reference voltage on comparator C3 1014 and comparator C4 1016, comparators C1 1004 through C3 1014 produce "1" outputs and comparators C4 1016 through C7 1020 produce "0" outputs. The point where the code changes from "1"s to "0"s is the point where the input signal becomes smaller than the respective comparator reference voltage levels. An error may occur when there is an offset voltage between the reference voltage input 1010 and the analog input 1012 of a comparator 1004. When this occurs the comparator may output the wrong value if the offset voltage adds or subtracts sufficient voltage from the analog input signal to either raise it above or reduce it below the reference voltage.

SOI transistors are especially sensitive to variation due to heating effects because the buried oxide (BOX) upon which SOI transistors are constructed is an excellent thermal insulator. The threshold voltage (vt) of a typical transistor may change by as much as 1 mV per 1 degree change in temperature.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An SOI integrated circuit with a matched transistor pair with a matching resistance heater coupled to each transistor of the matched transistor pair. A method for forming a matching resistance heater coupled to a transistor. A method for operating an SOI integrated circuit containing a matched transistor pair with a matching resistance heater coupled to each transistor of the matched transistor pair

DETAILED DESCRIPTION

Figure 1:
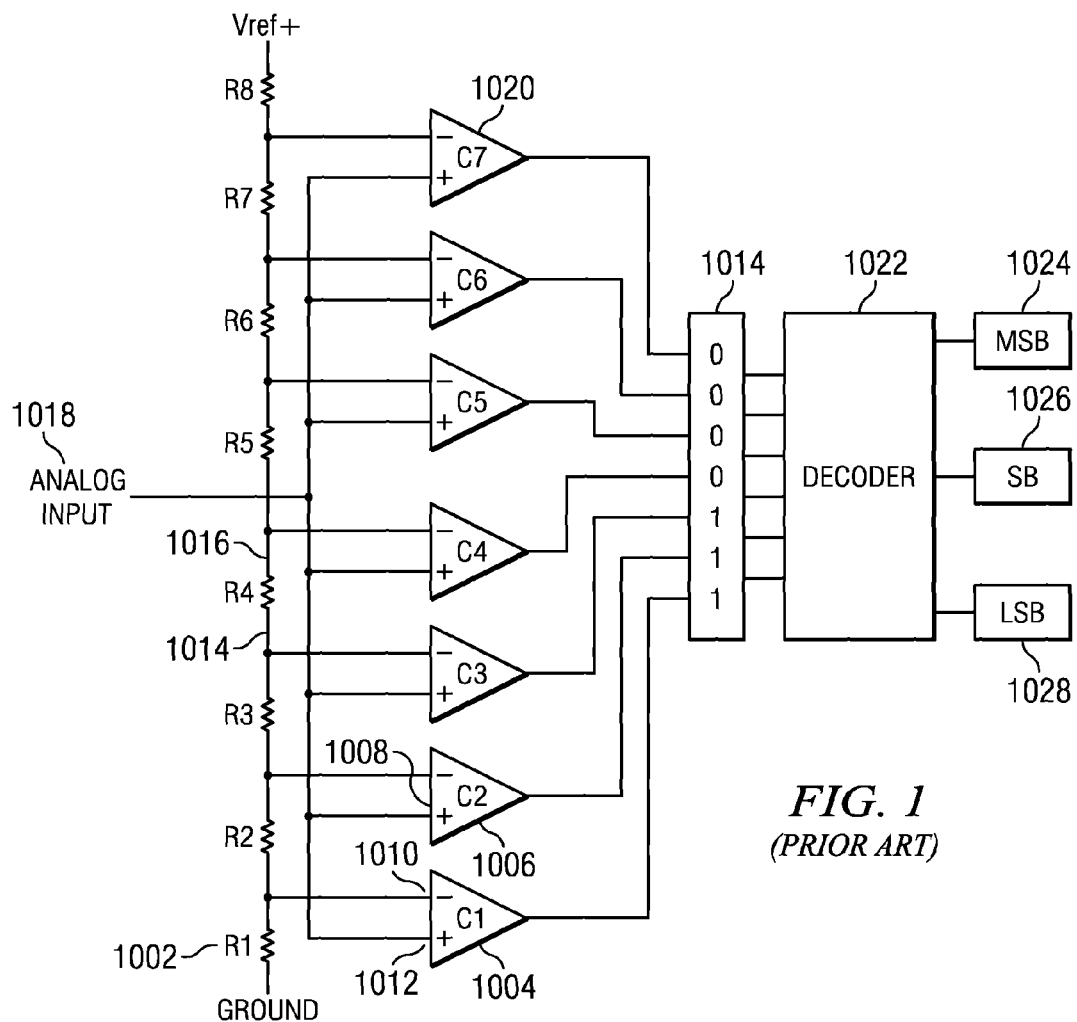
FIG. 1 is a circuit diagram of a conventional 3-bit ADC.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Figure 2:
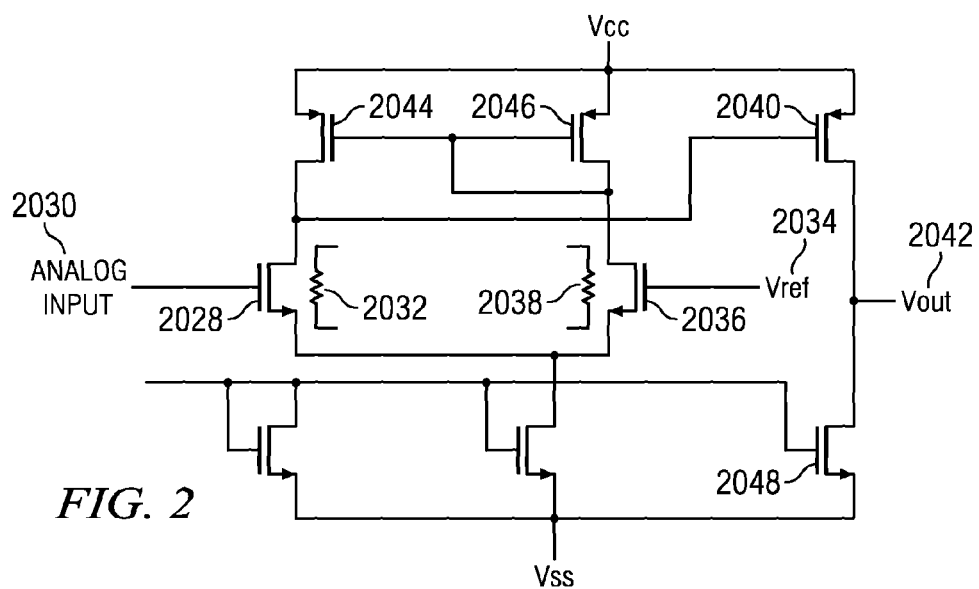
FIG. 2. is a circuit diagram of a comparator circuit according to an embodiment of the invention.

An embodiment is illustrated in FIG. 2 using a comparator circuit. An analog voltage 2030 which controls the gate voltage of nmos transistor 2028 may be compared to a reference voltage 2034 which controls the gate voltage of nmos transistor 2036. If the two nmos transistors, 2028 and 2036 are matched perfectly, when the analog voltage 2030 is higher than the reference voltage 2040, nmos transistor 2028 will be turned on harder than nmos transistor 2036 causing the voltage on the drain of nmos transistor 2028 to fall and the voltage on the drain of nmos transistor 2036 to rise. The rising voltage on the drain of nmos transistor 2036 causes the gate voltage of pmos transistors 2044 and 2046 to rise turning these transistors off. The drain of nmos transistor 2028 is pulled low which pulls the gate of pmos transistor 2040 low turning pmos transistor 2040 on pulling Vout 2042 up to a high voltage (logic state "1"). Conversely if the analog input voltage 2030 is lower than the reference voltage 2036, the drain of nmos transistor 2038 goes high taking the gate of pmos transistor 2040 high, which turns pmos transistor 2040 off. Vout 2042 is then pulled to a low voltage (logic state "0") by nmos transistor 2048.

If nmos transistors 2028 and 2036 are not perfectly matched, an incorrect logic state may result. For example, if the threshold voltage (vt) of transistor 2034 is 20 mv higher than the vt of transistor 2028, an analog signal 2030 that is actually up to about 19 mV higher than the reference voltage 2034 may output a "0" instead of a "1".

The number of bits in a flash analog to digital converter is limited by the matching accuracy of the comparator circuits. One way to improve matching between the comparator transistors is to increase the size of the input pair transistors. The impact of small differences in transistor parameters such as vt, gate length, transistor width, etc. are less pronounced for large transistors. However, larger transistors take up more area which is costly and also add capacitance which degrades performance especially at high frequency operation.

Transistor performance may be changed by changing the transistor temperature. The threshold voltage (vt) of a typical transistor may change by as much as 1 mV per 1 degree change in temperature. Tuning transistor performance is especially effective for SOI transistors which are thermally insulated because the buried oxide (BOX) upon which SOI transistors are constructed is an excellent thermal insulator. In this way, the matching of comparator transistors may be significantly improved with little to no increase in transistor area.

For example, as shown in FIG. 2, heater element 2032 may be used to adjust the performance of nmos transistor 2028 and heater element 2038 may be used to adjust the performance of nmos transistor 2036.

Figure 6:
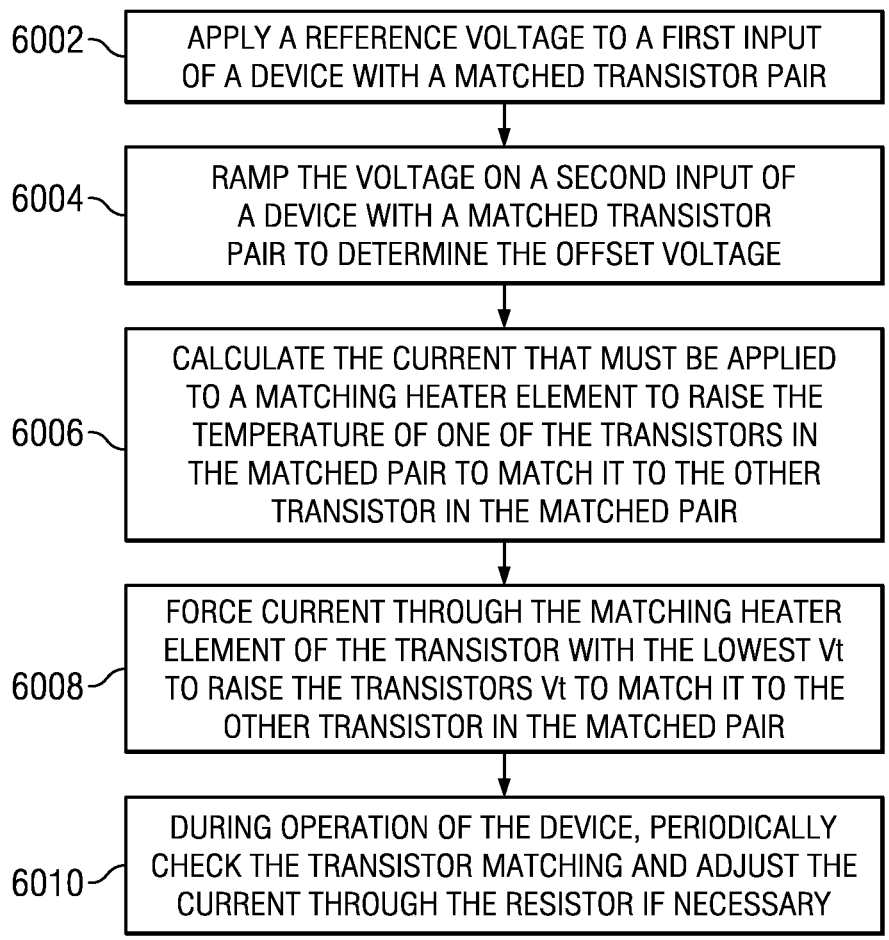
FIG. 6 is a flow diagram of the operation of an integrated circuit according to an embodiment of the invention.

A flow diagram illustrating embodiment matching of a matched transistor pair during operation is shown in FIG. 6. In step 1 6002 a reference voltage 2034 is applied to a first input (gate of transistor 2036 in FIG. 2). In step 2 6004 a ramped signal is applied to the other input (analog input 2030 in FIG. 2) to determine when Vout 2042 changes from "0" to "1". The value of the ramped signal voltage at which Vout 2042 changes is called the trip voltage. The offset voltage is the difference between the trip voltage and the reference voltage. If the two transistors are perfectly matched, the trip voltage equals the reference voltage 2034 so the offset voltage is zero. For a non-zero offset voltage, the matching heater current that is needed to raise the temperature of the transistor to compensate the offset voltage is calculated in step 6006. In step 6008, the calculated current level is then forced through the appropriate matching heater element to raise the vt of the transistor with the lower vt so that it will match the other transistor. For example, If the input signal 2030 is higher than the reference voltage 2036 when Vout 2042 trips, heater element 2038 may be used to increase the temperature of nmos transistor 2036 so that its vt matches the vt of 2028. If, on the other hand, the input signal 2030 is lower than the reference voltage 2036 when Vout 2041 trips, heater element 2032 may be used to increase the temperature of nmos transistor 2028 so that its vt matches the vt of 2036. During operation of the comparator, the recalibration may be performed periodically as shown in step 6010 to ensure the nmos comparison transistors 2028 and 2036 continue to be matched.

Figure 3:
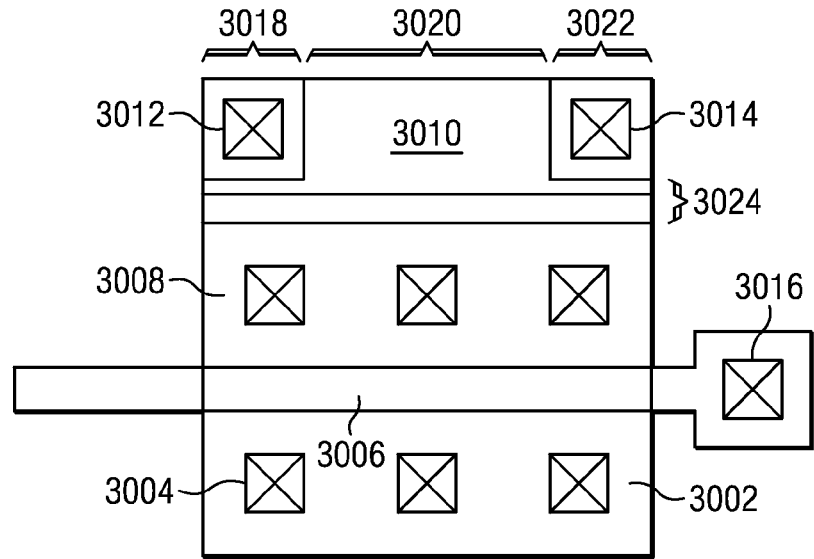
FIG. 3 is a plan view of a transistor with a matching resistance heater formed according to an embodiment of the invention.

An example embodiment SOI nmos transistor with a resistance heater element is shown in FIG. 3. The nmos SOI transistor consists of a transistor gate 3006 formed over p-type silicon into which an n+ source 3008 diffusion and an n+ drain 3002 diffusion are formed. A p-type resistance heater 3010 is formed adjacent to the n+ source. Silicide may be formed over the source 3008 and drain 3002 of the transistor and also over the heads 3018 and 3022 of the resistance heater 3010 where the contacts 3012 and 3014 are formed. Silicide is blocked from the body of the resistance heater 3020 and also blocked from the diode junction region 3024 between the p-type resistance heater 3010 and the n+ diffusion 3008 to prevent a short. Current may be forced through the resistance heater 3010 through contacts 3012 and 3014 to raise the temperature of the transistor to the desired level. In an example embodiment, with a mismatch of 6 mv between the two comparator transistors 2028 and 2036, a 1° C. change in transistor temperature changes the vt by 1.5 mV. To match the transistor vts, a temperature rise of about 4° C. is needed. In the embodiment the change in temperature of the SOI silicon substrate is about 2E5° C./watt so about 2E-4 watts may change the transistor temperature by 4° C. The resistance of resistor 3010 in this embodiment is about 5 kohm. When 1 V is applied across the 5 kohm resistor about 2E-4 watts is generated.

Figure 4A:
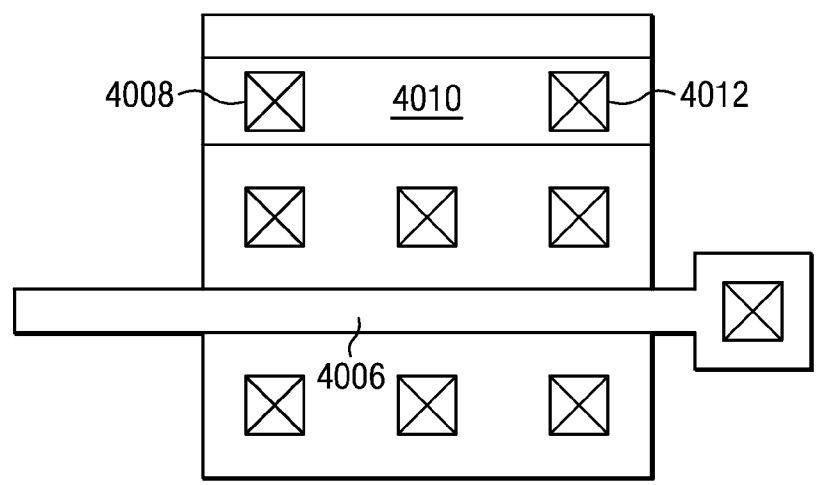
FIGS. 4A and 4B are plan views of a transistor with a matching resistance heater formed according to an embodiment of the invention.
Figure 4B:
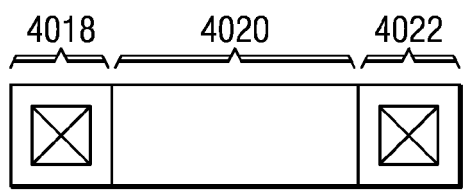

Another embodiment with a matching resistance heater is illustrated in FIGS. 4A and 4B. In this embodiment, a polysilicon resistor 4010 is formed at the same time as the transistor gate 4006. The resistor body 4020 is blocked during silicidation whereas the resistor heads 4018 and 4022 where contacts 4008 and 4012 are formed may be silicided. The temperature of the transistor may be raised a desired amount by forcing an appropriate current through the polysilicon resistor. This resistor may be added with no additional processing cost for a baseline cmos process flow that includes silicide block.

Figure 5A:
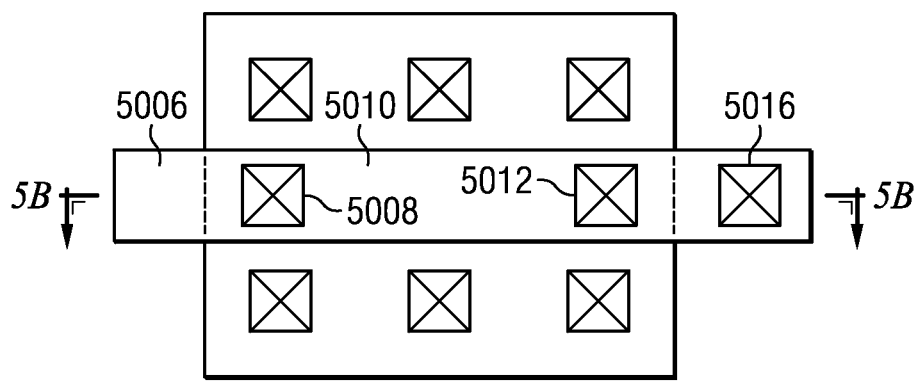
FIG. 5A is a plan view and FIG. 5B is a cross sectional view of a transistor with a matching resistance heater formed according to an embodiment of the invention.
Figure 5B:
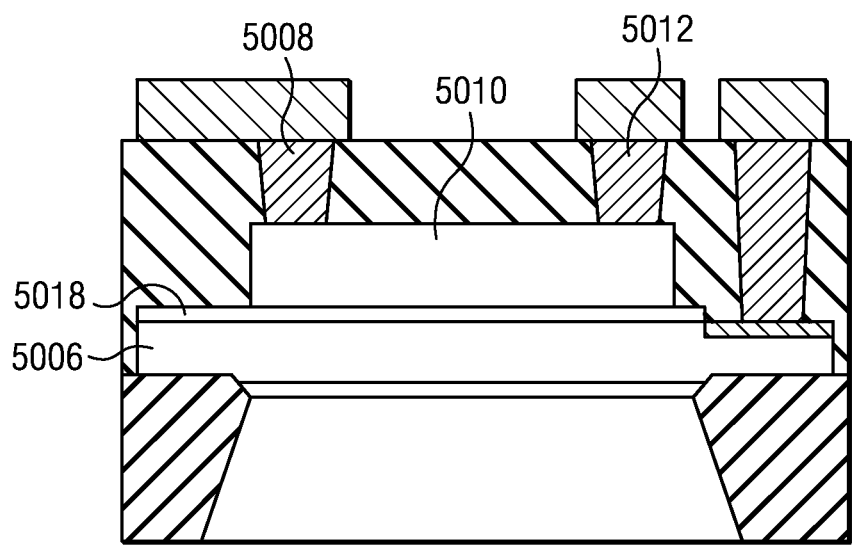

An additional embodiment matching heater is illustrated in FIGS. 5A and 5B. In a double poly integrated circuit flow that includes silicide block, matching heater element 5010 may be formed on top of the transistor gate 5006 with no additional processing cost. Top down view in FIG. 5A and cross-sectional view in FIG. 5B shows the matching heater element 5010 on top of the transistor gate 5006, with a layer of interpoly dielectric 5018 in between. Current may be forced through resistor 5010 through contacts 5008 and 5012 to raise the temperature of the transistor by the desired amount.

While the embodiments have been illustrated using nmos transistors in a comparator circuit, the instant invention also may be used to match transistors in other circuits such as the input pairs of operational amplifiers or current mirrors. Additionally, the embodiments are illustrated by forming a matching heater element on the source or drain of a transistor, but matching heater elements may be formed on both the source and drain of a transistor if desired.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An SOI integrated circuit, comprising:
   a first transistor and a second transistor where said first and said second transistors form a matched pair in said integrated circuit;
   a first matching heater element coupled to said first transistor but not the second transistor so as to alter the threshold voltage of the first transistor and a second matching heater element coupled to said second transistor but not the first transistor so as to alter the threshold voltage of the second transistor;
   wherein said first matching heater element is a silicon resistor formed in contact with a source or drain of said first transistor and wherein said second matching heater element is a distinct, second silicon resistor formed in contact with a source or drain of said second transistor.

2. The SOI integrated circuit of claim 1 where said first matching heater element is a first single crystal silicon resistor formed in contact with a source or drain of said first transistor and where said second matching heater element is a distinct, second single crystal silicon resistor formed in contact with a source or drain of said second transistor.

3. The SOI integrated circuit of claim 1 where said first matching heater element is a first poly-silicon resistor coupled to a source or drain of said first transistor and where said second matching heater element is a distinct, second poly-silicon resistor coupled to a source or drain of said second transistor.

4. The SOI integrated circuit of claim 3 where said first and said second poly silicon resistors are patterned and etched simultaneously with a transistor gate in said integrated circuit.

5. The SOI integrated circuit of claim 1 where said first matching heater element is a first poly-silicon resistor overlying a gate of said first transistor and where said second matching heater element is a distinct, second poly silicon resistor overlying a gate of said second transistor.

6. The SOI integrated circuit of claim 1 where said first transistor is an nmos transistor said first matching heater element is p-type single crystal silicon and where said second transistor is an nmos transistor said second matching heater element is p-type single crystal silicon.

7. The SOI integrated circuit of claim 1 where a resistance of said first matching heater element and said second matching heater element is between 100 ohms and 10 kohms.

8. The integrated circuit of claim 7 where the resistance of said first matching heater element and said second matching heater element is about 5 kohms.

9. An SOI integrated circuit, comprising:
   a first transistor and a second transistor where said first and said second transistors form a matched pair in said integrated circuit;
   a first matching polysilicon resistor heater element coupled to the first transistor but not the second transistor so as to alter the threshold voltage of the first transistor and a distinct, second matching polysilicon resistor heater element coupled to the second transistor but not the first transistor so as to alter the threshold voltage of the second transistor.

10. The SOI integrated circuit of claim 9, wherein the first polysilicon resistor is formed over a gate of the first transistor and the second polysilicon resistor is formed over a gate of the second transistor.

\* \* \* \* \*